US012568792B2

(12) United States Patent
Eguchi et al.

(10) Patent No.: US 12,568,792 B2
(45) Date of Patent: Mar. 3, 2026

(54) SEMICONDUCTOR DEVICE MANUFACTURING DEVICE AND MANUFACTURING METHOD

(71) Applicant: Yamaha Robotics Co., Ltd., Tokyo (JP)

(72) Inventors: Yuji Eguchi, Tokyo (JP); Kohei Seyama, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 665 days.

(21) Appl. No.: 17/915,094

(22) PCT Filed: Dec. 14, 2020

(86) PCT No.: PCT/JP2020/046618
§ 371 (c)(1),
(2) Date: Sep. 27, 2022

(87) PCT Pub. No.: WO2022/130472
PCT Pub. Date: Jun. 23, 2022

(65) Prior Publication Data
US 2023/0154775 A1     May 18, 2023

(51) Int. Cl.
*H01L 21/67* (2006.01)
*H01L 21/687* (2006.01)

(52) U.S. Cl.
CPC .. *H01L 21/67259* (2013.01); *H01L 21/67132* (2013.01); *H01L 21/68764* (2013.01)

(58) Field of Classification Search
CPC ......... H01L 21/67132; H01L 21/67259; H01L 21/68764
See application file for complete search history.

(56) References Cited

U.S. PATENT DOCUMENTS 9,406,640  B2    8/2016   Seyama
10,492,351 B2   11/2019   Sato et al.
(Continued)

FOREIGN PATENT DOCUMENTS

JP        2539071      10/1996
JP      2001308597     11/2001
(Continued)

OTHER PUBLICATIONS

Kawakami, JP2007157970A Bonding Method and Bonding Device, 2007, Espacenet. (Year: 2007).*

(Continued)

*Primary Examiner* — Mark A Connolly
(74) *Attorney, Agent, or Firm* — JCIPRNET

(57)     ABSTRACT

A semiconductor device manufacturing device (10) includes a stage (12), an installing head (14) that has a chip holding surface (26) and disposes a chip (100) on a substrate (110), a measuring mechanism (16) that measures a tilt angle of the chip (100) loaded on an installing surface (112) of the substrate (110) by the installing head (14) with respect to the installing surface (112) as a detection tilt angle Sd, a holding surface adjusting mechanism (18) that changes a holding surface tilt angle Sb which is a tilt angle of the chip holding surface (26) with respect to a loading surface (21), and a controller (20) that calculates a correction amount C of the holding surface tilt angle Sb based on the detection tilt angle Sd and changes the holding surface tilt angle Sb by the holding surface adjusting mechanism (18) according to the calculated correction amount C.

17 Claims, 9 Drawing Sheets

(56) References Cited

U.S. PATENT DOCUMENTS

| | | | | |
|---|---|---|---|---|
| 2003/0218144 A1* | 11/2003 | Lin | ....................... | H01L 21/681 |
| | | | | 250/559.29 |
| 2007/0272727 A1* | 11/2007 | Yang | ................... | H01L 21/6838 |
| | | | | 228/101 |
| 2018/0102340 A1 | 4/2018 | Kim et al. | | |
| 2022/0037175 A1* | 2/2022 | Park | ....................... | G01B 11/26 |
| 2022/0102185 A1* | 3/2022 | Lee | ....................... | H01L 21/681 |

FOREIGN PATENT DOCUMENTS

| | | |
|---|---|---|
| JP | 3323395 | 9/2002 |
| JP | 2007157970 | 6/2007 |
| JP | 2014022633 | 2/2014 |
| KR | 20180040349 | 4/2018 |
| SG | 11201504793 | 7/2015 |
| SG | 11201701130 | 3/2017 |
| WO | 2014098174 | 6/2014 |
| WO | 2016024364 | 2/2016 |

OTHER PUBLICATIONS

"International Search Report (Form PCT/ISA/210) of PCT/JP2020/046618," mailed on Mar. 9, 2021, with English translation thereof, pp. 1-4.

"Office Action of Taiwan Counterpart Application", issued on Sep. 29, 2022, with English translation thereof, pp. 1-11.

"Office Action of China Counterpart Application", issued on Mar. 29, 2025, with English translation thereof, pp. 1-22.

"Office Action of Singapore Counterpart Application", issued on Aug. 7, 2025, p. 1-p. 9.

* cited by examiner

<FIRST SUBSTRATE>

BASIC TILT ANGLE Ss [1]: +5°

HOLDING SURFACE TILT ANGLE Sb [1]: 0°

DETECTION TILT ANGLE Sd [1]: −5°

CORRECTION AMOUNT C [1]: 0°

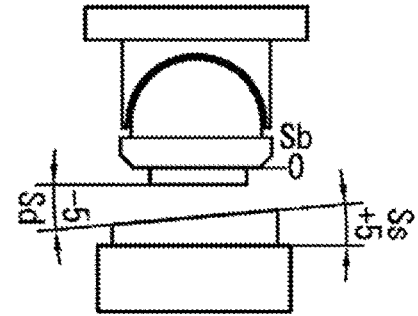

<SECOND SUBSTRATE>

BASIC TILT ANGLE Ss [2]: +10°

HOLDING SURFACE TILT ANGLE Sb [2]: +5°

DETECTION TILT ANGLE Sd [2]: −5°

CORRECTION AMOUNT C [2]: +5°

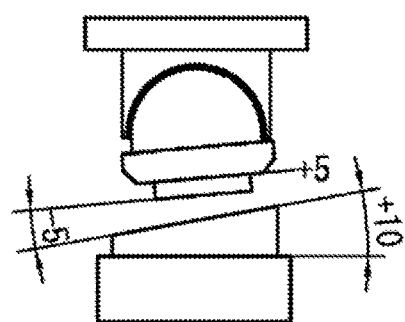

<THIRD SUBSTRATE>

BASIC TILT ANGLE Ss [3]: +5°

HOLDING SURFACE TILT ANGLE Sb [3]: +10°

DETECTION TILT ANGLE Sd [3]: +5°

CORRECTION AMOUNT C [3]: +5°

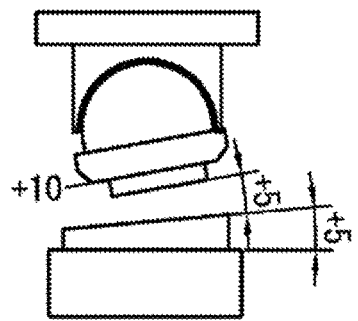

<FOURTH SUBSTRATE>

BASIC TILT ANGLE Ss [4]: −5°

HOLDING SURFACE TILT ANGLE Sb [4]: +5°

DETECTION TILT ANGLE Sd [4]: +10°

CORRECTION AMOUNT C [4]: −5°

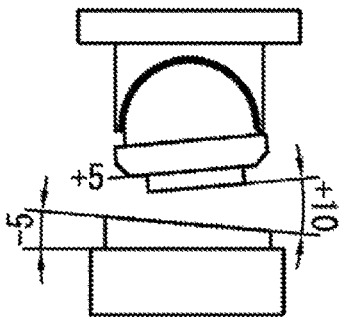

FIG. 5

SEMICONDUCTOR DEVICE MANUFACTURING DEVICE AND MANUFACTURING METHOD

CROSS-REFERENCE TO RELATED APPLICATION

This application is a 371 application of the International PCT application serial no. PCT/JP2020/046618, filed on Dec. 14, 2020. The entirety of the above-mentioned patent application is hereby incorporated by reference herein and made a part of this specification.

TECHNICAL FIELD

The present specification discloses a manufacturing device and a manufacturing method in which a semiconductor device is manufactured with one or more chips bonded on a substrate.

RELATED ART

In the related art, a manufacturing device for installing one or more chips on a substrate to manufacture a semiconductor device is known. Such a manufacturing device has an installing tool that sucks and holds a chip, and when the chip is disposed on the substrate, the installing tool is moved such that the chip is disposed in a desired position. Further, when the chip is disposed on the substrate, it is also important that a bonding surface of the chip facing the substrate be parallel to an installing surface of the substrate. If the chip is tilted with respect to the installing surface, the chip causes an installing defect with respect to the substrate. For example, an electrical bonding defect may occur between a bump electrode of the chip and an electrode of the substrate.

Here, in Patent Literature 1, a technique in which, when an IC component is temporarily pressure-bonded to an electrode provided in a flat panel display, the amount of misalignment of the mounted IC component with respect to the electrode is detected by a camera, and in a case in which the amount of misalignment is not appropriate, the amount of misalignment is fed back to correct a temporary pressure bonding operation of a next IC component is disclosed. Further, in Patent Literature 1, a technique in which a bonding state between a bump and an electrode is detected, and in a case in which the bonding state is not appropriate, a warning is output assuming that a degree of parallelization between the IC component and the display exceeds the allowable range is also disclosed. According to the technique of Patent Literature 1, the amount of misalignment is appropriately detected and fed back, and thus positioning accuracy of the IC component can be kept high.

CITATION LIST

Patent Literature

Patent Literature 1

Japanese Patent No. 3323395

SUMMARY OF INVENTION

Technical Problem

However, in the technique of Patent Literature 1, the degree of parallelization is determined as only good or bad, and no feedback is given. Therefore, in the related art such as Patent Literature 1, the degree of parallelization of the chip with respect to the substrate cannot be kept high.

Therefore, the present specification discloses a semiconductor device manufacturing device capable of further improving the degree of parallelization of the chip with respect to the substrate.

Solution to Problem

A semiconductor device manufacturing device disclosed in the present specification includes a stage that has a loading surface on which a substrate is loaded; an installing head that has a chip holding surface for holding a chip and disposes the chip on the substrate loaded on the stage; a measuring mechanism that measures a tilt angle of the chip loaded on an installing surface of the substrate by the installing head with respect to the installing surface as a detection tilt angle; a holding surface adjusting mechanism that changes a holding surface tilt angle which is a tilt angle of the chip holding surface with respect to the loading surface; and a controller that calculates a correction amount of the holding surface tilt angle on the basis of the detection tilt angle and changes the holding surface tilt angle by the holding surface adjusting mechanism according to the correction amount calculated.

In this case, the controller may store a plurality of the detection tilt angles measured in the past, and the controller may obtain a basic tilt angle by removing an influence of correction of the holding surface tilt angle from each of the plurality of detection tilt angles and may change a calculation policy of the correction amount according to a change tendency of the basic tilt angle between the substrates.

Further, in a case in which a variation of the basic tilt angle between the substrates is equal to or less than a specified allowable value, the controller may calculate a value to cancel the detection tilt angle obtained for a nearest substrate as the correction amount.

Further, in a case in which the basic tilt angle changes between the substrates with a predetermined regularity, the controller may estimate a basic tilt angle of a next substrate according to the regularity and may calculate a value to cancel the basic tilt angle as the correction amount.

Further, in a case in which the basic tilt angle changes randomly between the substrates, the controller may estimate a representative value of a plurality of the basic tilt angles obtained for a plurality of the substrates as a basic tilt angle of a next substrate and may calculate a value to cancel the basic tilt angle as the correction amount.

Further, in a case in which the detection tilt angle is obtained for each of a plurality of chips loaded on one substrate, the controller may treat a representative value of a plurality of the detection tilt angles obtained for the plurality of chips as the detection tilt angle of the one substrate.

Further, in a case in which the detection tilt angle is obtained for each of a plurality of chips loaded on one substrate, the controller may generate a map in which a correspondence between a position of each chip in the substrate and the detection tilt angle of each chip is recorded and may calculate the correction amount for each chip position on the basis of the map.

Further, the installing head may have an installing tool that includes the chip holding surface and a spherical air bearing that holds the installing tool, the spherical air bearing may be capable of switching between a free state in which the installing tool is held with its swinging allowed and a locked state in which the installing tool is held with its swinging hindered, and the holding surface adjusting mechanism may have a tilt plate with which the chip holding surface is brought into contact, and a plurality of support columns that supports the tilt plate and advances and retreats independently of each other to arbitrarily change an angle of the tilt plate.

A semiconductor device manufacturing method disclosed in the present specification includes a bonding step of holding a chip with a chip holding surface of an installing tool and moving the installing tool to load the chip on an installing surface of a substrate loaded on an loading surface of a stage; a measurement step of measuring a tilt angle between an upper surface of the chip loaded on the installing surface and the installing surface as a detection tilt angle; a correction amount calculation step of calculating a correction amount of a holding surface tilt angle, which is a tilt angle of the chip holding surface with respect to the stage, on the basis of the detection tilt angle; and a correction step of changing the holding surface tilt angle according to the correction amount by a holding surface adjusting mechanism that changes the holding surface tilt angle.

Advantageous Effects of Invention

According to the technique disclosed in the present specification, the degree of parallelization of the chip with respect to the substrate can be further improved.

BRIEF DESCRIPTION OF DRAWINGS

FIG. 5 is a view showing examples of changes in various parameters in a case in which a process is executed according to the flow of FIG. 4.

DESCRIPTION OF EMBODIMENTS

Figure 1:
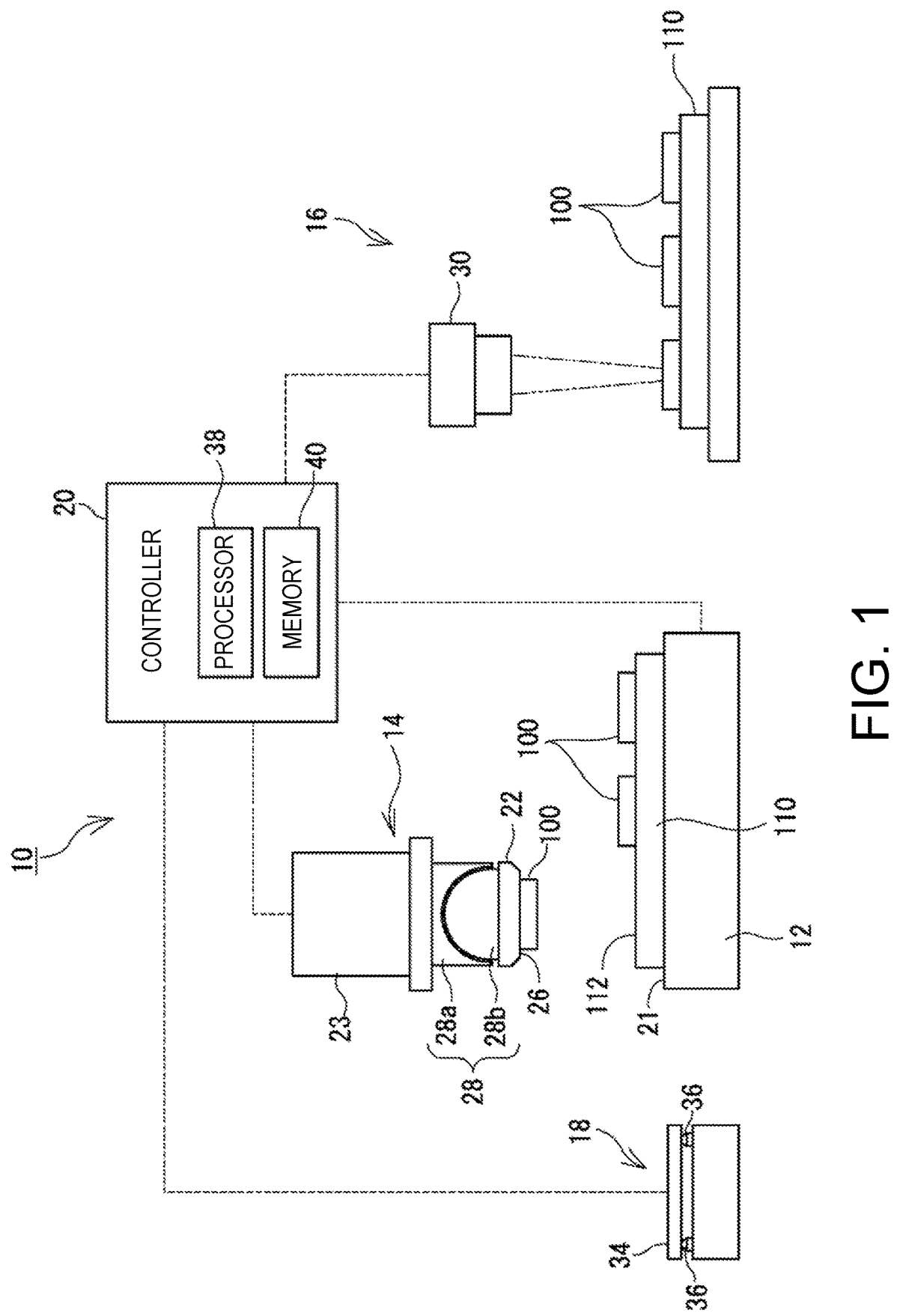
FIG. 1 is a conceptual view showing a configuration of a manufacturing device.

Hereinafter, a configuration of a semiconductor device manufacturing device 10 will be described with reference to the drawings. FIG. 1 is a conceptual view showing a configuration of the manufacturing device 10. The manufacturing device 10 is a device that manufactures a semiconductor device by installing a chip 100, which is an electronic component, on a substrate 110 in a face-down state. The manufacturing device 10 includes a stage 12 on which the substrate 110 is loaded, an installing head 14 that installs the chip 100 on the substrate 110, a measuring mechanism 16 that measures a degree of parallelization of the installed chip 100 with respect to the substrate 110, a holding surface adjusting mechanism 18 that changes a tilt of a chip holding surface 26 of the installing head 14, and a controller 20 that controls the drive of the installing head 14 or the holding surface adjusting mechanism 18.

The stage 12 can suck and hold the substrate 110, and a heater (not shown) for heating the substrate 110 is installed inside the stage 12. The heating and suction of the stage 12 are controlled by the controller 20, which will be described later. An upper surface of the stage 12 functions as a loading surface 21 on which the substrate 110 is loaded. The stage 12 of the present example is a fixed stage of which vertical and horizontal positions do not change, but in some cases, the stage 12 may be movable in at least one of a vertical direction and a horizontal direction.

The installing head 14 includes an installing tool 22 that sucks and holds the chip 100, and a moving mechanism (not shown) that moves the installing tool 22 in the horizontal direction and the vertical direction. The installing tool 22 is disposed to face the substrate 110, and a tip end surface thereof functions as the chip holding surface 26 that sucks and holds the chip 100. Further, a heater (not shown) for heating the held chip 100 is built in the installing tool 22. The installing tool 22 sucks and holds the chip 100 with the chip holding surface 26, loads the chip 100 on a surface (hereinafter referred to as an "installing surface 112") of the substrate 110, and heats and pressurizes the chip 100 to bond the chip 100 to the substrate 110.

Further, the installing head 14 of the present example has a spherical air bearing 28. The spherical air bearing 28 has a fixed portion 28a and a movable portion 28b, one of the fixed portion 28a and the movable portion 28b has a concave hemispherical surface, and the other has a convex hemispherical surface that slides inside the concave hemispherical surface. Swinging of the movable portion 28b with respect to the fixed portion 28a is controlled by sucking or supplying air from or to the gap between the two portions. That is, when air is supplied to the gap, three-dimensional swinging of the movable portion 28b with respect to the fixed portion 28a is allowed, and when air is sucked from the gap, three-dimensional swinging of the movable portion 28b with respect to the fixed portion 28a is hindered. In the following, a state in which air is supplied and the swinging of the movable portion 28b is allowed is referred to as a "free state," and a state in which air is sucked and the swinging of the movable portion 28b is hindered is referred to as a "locked state." In the present example, the movable portion 28b of the spherical air bearing 28 is attached to the installing tool 22, and the fixed portion 28a is attached to a main body 23 of the installing head 14. In this case, by pressing the chip holding surface 26 against a desired surface after the spherical air bearing 28 is made to be in a free state, it is possible to make the chip holding surface 26 parallel to the desired surface. In other words, by providing the spherical air bearing 28, it is possible to change swinging of the installing tool 22 with respect to the main body 23 and a tilt angle (hereinafter referred to as a "holding surface tilt angle Sb") of the chip holding surface 26 with respect to the loading surface 21.

When the chip 100 is installed on the substrate 110, the installing tool 22 is lowered toward the substrate 110 in a state in which the chip 100 is held with the chip holding surface 26, and the chip 100 is loaded on the installing surface 112 of the substrate 110. Then, the chip 100 is heated and pressurized in that state, and thus a bump 102 (see FIGS. 3A and 3B) provided on a bottom surface of the chip 100 is welded to an electrode 114 (see FIGS. 3A and 3B) of the substrate 110.

The measuring mechanism 16 measures an installed state of the chip 100 on the substrate 110, particularly, a tilt angle of the chip 100 with respect to the installing surface 112. The measured tilt angle of the chip 100 is transmitted to the controller 20 as a detection tilt angle Sd. The controller 20 corrects the holding surface tilt angle Sb on the basis of the obtained detection tilt angle Sd, which will be described later.

The method for measuring the detection tilt angle Sd is not particularly limited, and for example, a contact-type tilt sensor, a non-contact-type distance sensor, or the like may be used for measurement. For example, in a case in which a laser measuring device 30 that measures a distance in a non-contact manner is used, the laser measuring device 30 measures distances to a plurality of substrate-side measuring points set on the installing surface 112 and distances to a plurality of chip-side measuring points set on an upper surface of the chip 100. Then, the measuring mechanism 16 calculates a tilt angle of the installing surface 112 on the basis of the distances to the plurality of substrate-side measuring points, calculates a tilt angle of the upper surface of the chip 100 on the basis of the distances to the plurality of chip-side measuring points, and calculates the tilt angle of the chip 100 with respect to the installing surface 112, that is, the detection tilt angle Sd from the two tilt angles. The method for measuring the detection tilt angle Sd described here is an example and may be changed as appropriate.

Figure 2:
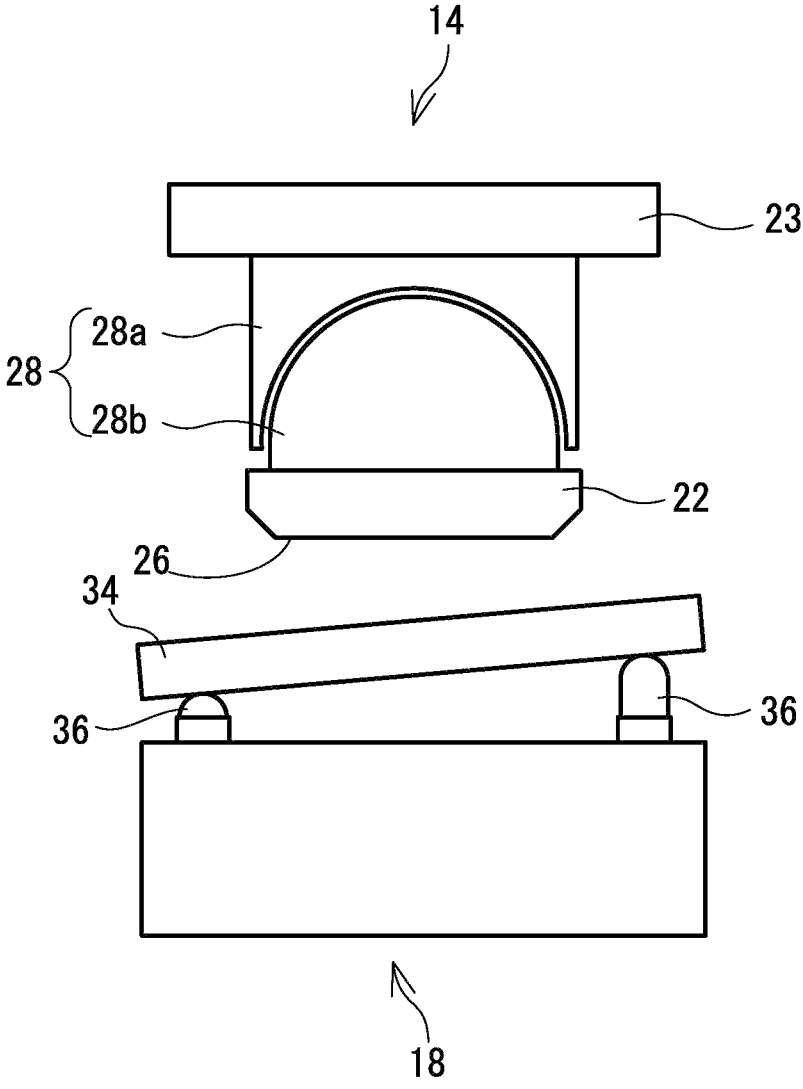
FIG. 2 is a conceptual view showing a configuration of a holding surface adjusting mechanism.

The holding surface adjusting mechanism 18 is a mechanism that adjusts the tilt angle of the chip holding surface 26 with respect to the loading surface 21, that is, the holding surface tilt angle Sb. Specifically, the holding surface adjusting mechanism 18 has a tilt plate 34 with which the chip holding surface 26 is brought into contact. The tilt plate 34 is supported by a plurality of support columns 36 that can advance and retreat arbitrarily, and as shown in FIG. 2, it is possible to change a tilt angle of the tilt plate 34 by adjusting protrusion amounts of arbitrary support columns 36. In a case in which the holding surface tilt angle Sb is adjusted, in advance, the support columns 36 are advanced and retreated to adjust the tilt plate 34 to a desired tilt angle, and the installing tool 22 is made to be in the free state in which the installing tool 22 can be swung with respect to the main body 23. In this state, the chip holding surface 26 is brought into contact with the tilt plate 34, and the chip holding surface 26 is made to conform with the tilt plate 34. Then, when the chip holding surface 26 completely conforms with the tilt plate 34, the installing tool 22 is switched to a locked state in which the swinging of the installing tool 22 is hindered. As a result, the holding surface tilt angle Sb is fixed at the same tilt angle as the tilt plate 34.

The controller 20 controls the drive of each part of the manufacturing device 10. Specifically, the controller 20 drives the installing head 14 to execute a bonding process for bonding the chip 100 to the substrate 110. Further, the controller 20 of the present example causes the holding surface adjusting mechanism 18 to execute a correction process of the tilt of the chip holding surface 26 as necessary, which will be described later. Such a controller 20 is a computer having a processor 38 that executes various operations and a memory 40 that stores data and programs.

Figure 3A:
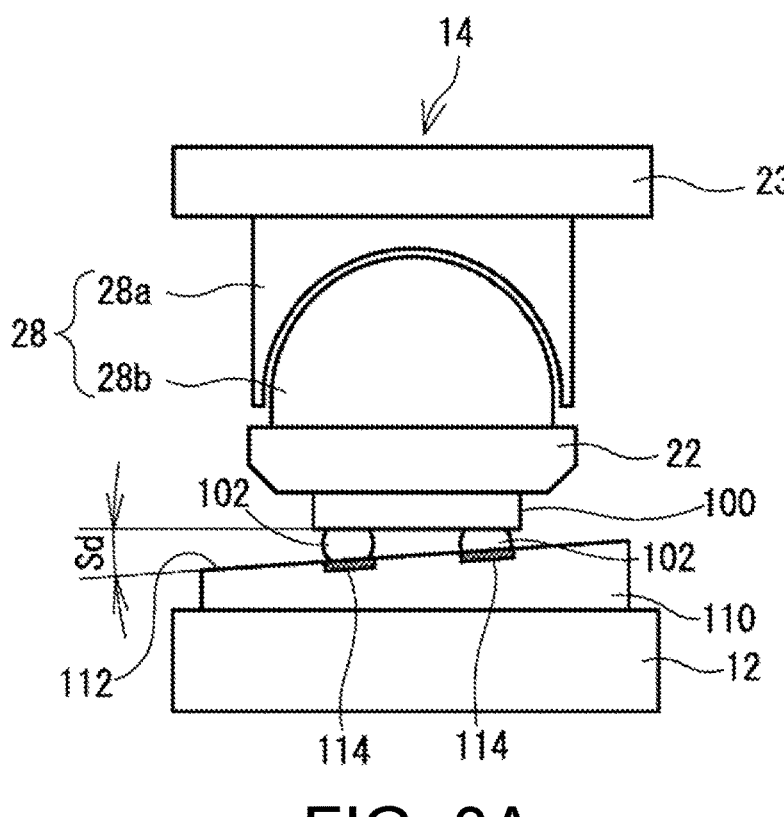
FIG. 3A is a conceptual view showing a state of a bonding process of a chip.

Next, the correction process of the holding surface tilt angle Sb will be described. As shown in FIG. 3A, the bump 102 that functions as an electrode is formed on the bottom surface of the chip 100. When the chip 100 is installed, the chip 100 is loaded on the installing surface 112 of the substrate 110 such that the bump 102 comes into contact with the electrode 114 of the substrate 110, and then the chip 100 is heated and pressurized by the installing tool 22. To ensure good installing quality, it is necessary to keep the chip 100 and the installing surface 112 parallel to each other during this pressurization and heating. In a case in which the chip 100 and the installing surface 112 are not parallel to each other, electrical bonding failure may occur between the bump 102 and the electrode 114.

Therefore, in the manufacturing device 10 of the related art, the holding surface tilt angle Sb is adjusted such that the chip holding surface 26 is parallel to the loading surface 21 of the stage 12 prior to the installing of the chip 100. Specifically, prior to the installing of the chip 100, the chip holding surface 26 is pressed against the loading surface 21 to make the installing tool 22 conform with the loading surface 21.

However, since the manufacturing device 10 of the related art merely adjusts the tilt of the installing tool 22 with respect to the stage 12, the degree of parallelization of the chip 100 with respect to the installing surface 112 of the substrate 110 is not sufficiently ensured. For example, as shown in FIG. 3A, even though the chip holding surface 26 is adjusted parallel to the loading surface 21, if the upper surface (the mounting surface 112) of the substrate 110 is tilted with respect to a lower surface thereof due to a temperature change, a manufacturing error of the substrate 110, or the like, the chip 100 is tilted with respect to the installing surface 112.

Figure 3B:
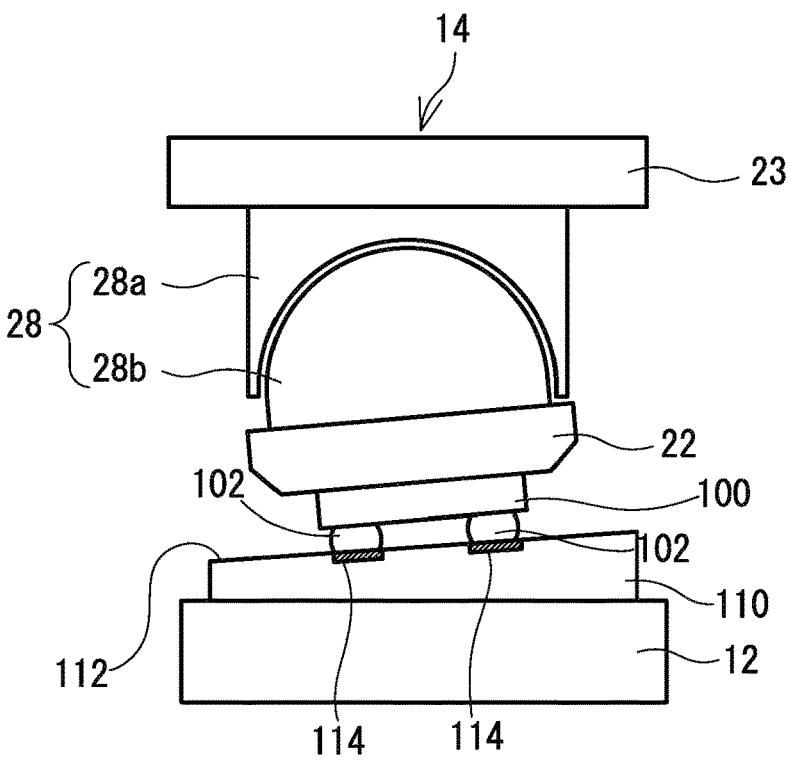
FIG. 3B is a conceptual view showing a state in which a holding surface tilt angle is corrected.

Therefore, in the present example, as necessary, the tilt angle of the chip 100 with respect to the installing surface 112 is measured as the detection tilt angle Sd, and the holding surface tilt angle Sb is corrected to cancel the detection tilt angle Sd. FIG. 3B is a conceptual view showing a state after correction.

Figure 4:
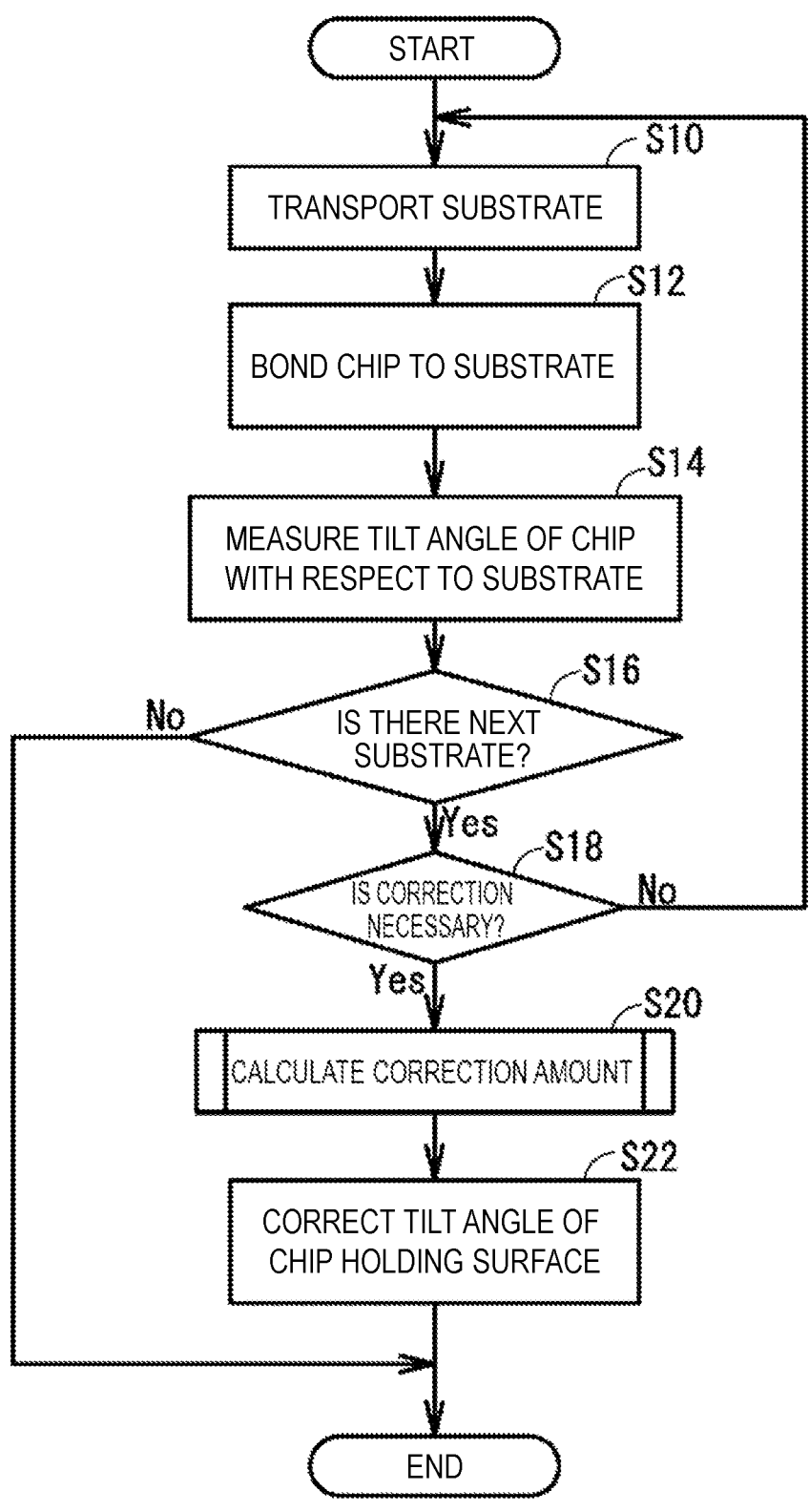
FIG. 4 is a flowchart showing a flow in manufacturing a semiconductor device by a manufacturing device of the present example.

In the present example, the measurement of the detection tilt angle Sd and the correction of the holding surface tilt angle Sb are performed for each substrate 110. This will be described with reference to FIG. 4. FIG. 4 is a flowchart showing a flow in manufacturing a semiconductor device by the manufacturing device 10 of the present example.

When a semiconductor device is manufactured, first, the substrate 110 is transported to the stage 12 and is loaded on the stage 12 (S10). Subsequently, the installing head 14 is driven to bond the chip 100 to the substrate 110. That is, the chip 100 is loaded at a predetermined position on the substrate 110 and is heated and pressurized (S12). If the required number of chips 100 can be bonded to one substrate 110, the substrate 110 after the bonding is transported to the measuring mechanism 16.

The measuring mechanism 16 measures the tilt angle of the chip 100 with respect to the installing surface 112 as the detection tilt angle Sd and transmits the detection tilt angle Sd to the controller 20 (S14). Here, in a case in which a plurality of chips 100 is mounted on one substrate 110, the measuring mechanism 16 may measure the detection tilt angle Sd for only one representative chip 100 (for example, a chip 100 installed on a center of the substrate 110 or the like) of the plurality of chips 100. Further, as another form, the measuring mechanism 16 may measure the detection tilt angle Sd for each of the plurality of chips 100. In this case, the controller 20 treats a representative value of a plurality of detection tilt angles Sd obtained for one substrate 110 as the detection tilt angles Sd of the one substrate 110. Here, the "representative value" is a statistical value representing a central position of the distribution of data and is, for example, a mean, a median, or a mode. In any case, the controller 20 associates one detection tilt angle Sd with one substrate 110 and stores it in the memory 40.

If the detection tilt angle Sd is obtained, the controller 20 checks the presence or absence of a next substrate 110 (S16). If there is no next substrate 110 No in S16), the manufacturing process ends. On the other hand, in a case in which there is a next substrate 110 (Yes in S16), the controller 20 determines whether or not the holding surface tilt angle Sb needs to be corrected for the next substrate 110 on the basis of the detection tilt angle Sd (S18). Specifically, the controller 20 compares the obtained detection tilt angle Sd with a specified allowable tilt value. As a result of the comparison, in a case in which the detection tilt angle Sd is equal to or less than the allowable tilt value, it is determined that the current holding surface tilt angle Sb is appropriate and correction is not necessary (No in S18). In this case, the controller 20 returns to step S20 and executes the next bonding process on the new substrate 110 without correcting the holding surface tilt angle Sb. On the other hand, when the detection tilt angle Sd exceeds the allowable tilt value, the controller 20 determines that the holding surface tilt angle Sb needs to be corrected (Yes in S18). In this case, the controller 20 reduces a next detection tilt angle Sd and calculates a correction amount C such that the tilt angle of the chip 100 approaches the tilt angle of the installing surface 112 (S20). The calculation of the correction amount C will be described later.

If the correction amount C can be calculated, the controller 20 corrects the holding surface tilt angle Sb by the correction amount C using the holding surface adjusting mechanism 18 (S22). Specifically, the amount of the advancing and retreating of the support column 36 is adjusted to change the tilt angle of the tilt plate 34 to a tilt angle according to the correction amount C. Then, the installing tool 22 switched to the free state is pressed against the tilt plate 34 to make the chip holding surface 26 conform the tilt plate 34, and then the installing tool 22 is switched to the fixed state. When the correction of the holding surface adjusting mechanism 18 is completed, the process returns to step S10, and the chip 100 is installed on the new substrate 110. Then, finally, when the installing of the chip 100 is completed for all the necessary substrates 110 (No in S16), the manufacturing process is completed.

In this way, in the present example, the tilt angle of the installed chip 100 with respect to the installing surface 112 is measured, and the measurement result is fed back to the next and subsequent installing operations. As a result, the degree of parallelization of the chip 100 with respect to the installing surface 112 can be further improved.

Next, the calculation of the correction amount C will be described. A calculation procedure of the correction amount C is not particularly limited as long as the detection tilt angle Sd in the next substrate 110 approaches zero. In the present example, a basic tilt angle Ss is calculated by removing an influence of the correction of the holding surface tilt angle Sb from each of the plurality of detection tilt angles Sd obtained for the plurality of substrates 110, and a calculation policy of the correction amount C is changed according to a change tendency of the basic tilt angle Ss between the substrates.

Prior to the detailed description of the calculation of the correction amount C, parameters used in the calculation of the correction amount C will be described with reference to FIG. 5. FIG. 5 is a view showing examples of changes of various parameters when the installing of the chip 100, the measuring of the detection tilt angle Sd, the correction of the holding surface tilt angle Sb are repeatedly executed with respect to four substrates 110 according to the flow of FIG. 4. Even in a case in which the holding surface tilt angle Sb is kept constant, the degree of parallelization of the chip 100 with respect to the installing surface 112 varies between the substrates 110. There are various causes of the variation in the degree of parallelization between the substrates, such as a change in temperature or load, a correction error, and a variation in quality of the substrate 110, but in FIG. 5, these are collectively expressed as a tilt of the installing surface 112 of the substrate 110. Then, the tilt of the installing surface 112 of the substrate 110 in FIG. 5 is a tilt angle obtained by removing the influence of the correction from the detection tilt angle Sd and is a detection tilt angle Sd that can be obtained in a case in which the correction of the holding surface tilt angle Sb is not performed at all. In the following, the detection tilt angle (the tilt angle of the installing surface 112 in FIG. 5) that can be obtained in a case in which this correction is not performed is the "basic tilt angle Ss."

In a case in which the detection tilt angle Sd, the basic tilt angle Ss, the holding surface tilt angle Sb, and the correction amount C of an n-th substrate 110 are set to Sd [n], Ss [n], Sb [n], and C [n], respectively, the n-th holding surface tilt angle Sb [n] and the n-th basic tilt angle Ss [n] can be expressed by the following equation 1 and equation 2, respectively.

$$Sb[n]=Sb[n-1]+C[n] \qquad\qquad \text{equation 1}$$

$$Ss[n]=Sb[n]-Sd[n] \qquad\qquad \text{equation 2}$$

In the example of FIG. 5, since the correction of the holding surface tilt angle Sb has never been performed at a step of a first substrate 110, the correction amount C[1]=0°, and the holding surface tilt angle Sb[1]=0°. In this case, in a case in which it can be measured that the detection tilt angle Sd[1]=−5°, it can be calculated that the basic tilt angle Ss[1]=Sb[1]−Sd[1]=+5°.

To cancel the detection tilt angle Sd [1] of the first substrate, it is assumed that the correction amount C[2]=−Sd[1]=+5° for a second substrate 110. In this case, in the second substrate 110, the holding surface tilt angle Sb [2] is that Sb[2]=Sb[1]+C[2]=+5°. Then, in a case in which the detection tilt angle Sd [2] of the second substrate 110=−5°, the basic tilt angle Ss [2] of the second substrate 110 can be calculated as Ss[2]=Sb[2]−Sd[2]=+10°. Similarly, for third and subsequent substrates, the basic tilt angle Ss [n] can be calculated on the basis of the detection tilt angle Sd [n].

Figure 6A:
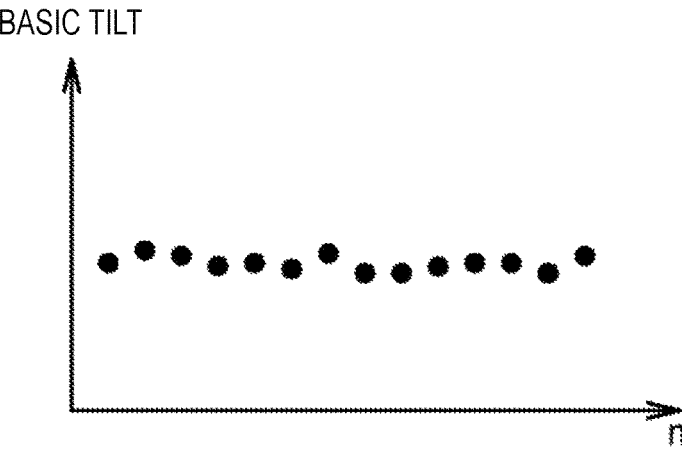
FIG. 6A is a diagram showing an example of a change tendency of a basic tilt angle.
Figure 6B:
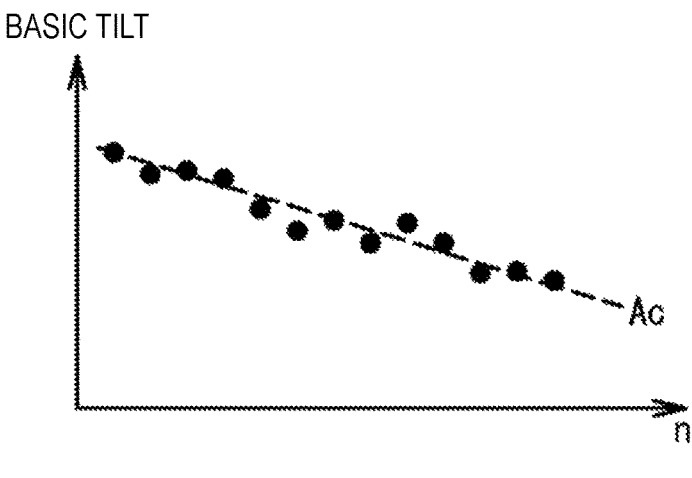
FIG. 6B is a diagram showing another example of a change tendency of a basic tilt angle.
Figure 6C:
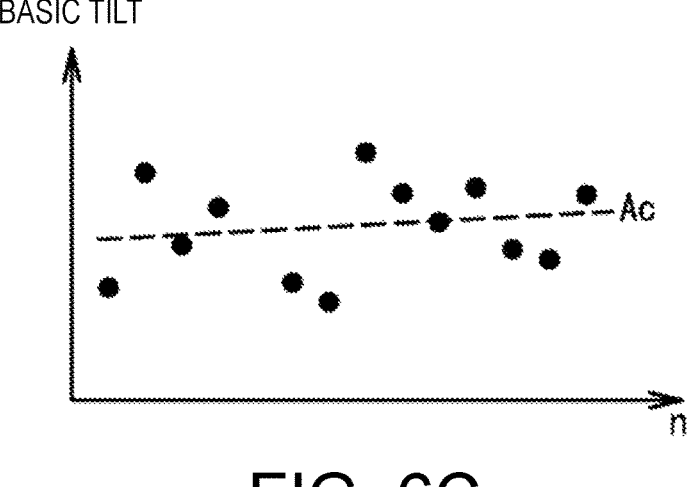
FIG. 6C is a diagram showing still another example of a change tendency of a basic tilt angle.

The controller 20 sequentially calculates the basic tilt angles Ss according to equations 1 and 2, identifies a change tendency of the basic tilt angle Ss between the substrates, and calculates the correction amount C by a procedure suitable for the change tendency. In the present example, the change tendency is divided into three types: a "small variation," a "regularity," and a "random change." FIGS. 6A to 6C are diagrams for explaining these three types of change tendencies. In each figure, a horizontal axis represents the number of samples n of the substrate 110, and a vertical axis represents the basic tilt angle Ss of the n-th substrate 110.

As shown in FIG. 6A, in a case in which the variation of a plurality of basic tilt angles Ss is small, it can be said that the causes of the tilt of the chip 100 with respect to the installing surface 112, for example, the temperature change, the quality of the substrate, or the like are generally stable. Therefore, in this case, the controller 20 calculates a value to cancel a nearest detection tilt angle Sd [n] as a correction amount C [n+1] of the next substrate 110. That is, the controller 20 performs an operation of C[n+1]=−Sd[n]. For the evaluation of a variation, for example, a variance or a standard deviation is used. Therefore, for example, the controller 20 obtains a standard deviation of the plurality of basic tilt angles Ss, and in a case in which the standard deviation is equal to or less than a predetermined allowable value, the correction amount C is calculated as C[n+1]=−Sd[n].

On the other hand, as shown in FIG. 6B, in a case in which the basic tilt angle Ss changes with a predetermined regularity, it can be inferred that the causes of the tilt of the chip 100 with respect to the installing surface 112 also change with a regularity. Therefore, in this case, the controller 20 obtains a basic tilt angle Ss[n+1] of the next substrate 110 according to this regularity and calculates a value to cancel the basic tilt angle Ss[n+1] as a correction amount C of the next substrate 110. For example, in a case in which a and b are constants, a case in which the basic tilt angle Ss changes according to a linear function of "Ss[n]=a×n+b" is considered. In this case, the basic tilt angle Ss[n+1] of the next substrate 110 can be inferred to be Ss[n+1]=a×(n+1)+b.

Further, a detection tilt angle Sd[n+1] of the next substrate 110 is expressed by the following equation 3. Then, since a correction amount C[n+1] of the next substrate 110 is a value that makes the detection tilt angle Sd[n+1] zero, it can be obtained by equation 4.

$$Sd[n+1]=Sb[n]+C[n+1]-Sd[n+1] \qquad \text{equation 3}$$

$$C[n+1]=Sd[n+1]-Sb[n] \qquad \text{equation 4}$$

First, for example, an approximate curve Ac of the plurality of basic tilt angles Ss is obtained, and then whether or not the change is made with a regularity may be determined on the basis of a degree of approximation between the approximate curve Ac and the plurality of basic tilt angle Ss. Here, the approximate curve Ac is not limited to the linear function as described above and may be a quadratic function, an exponential function, a logarithmic function, or the like. Further, the degree of approximation may be expressed by, for example, a mean square error between the approximate curve Ac and the plurality of basic tilt angles Ss. That is, the controller 20 may determine that the basic tilt angle Ss changes regularly in a case in which the mean square error of the plurality of basic tilt angles Ss with respect to the approximate curve Ac is equal to or less than a predetermined allowable value.

Next, as shown in FIG. 6C, a case in which the basic tilt angle Ss changes randomly without a regularity, that is, a case in which the mean square error of the plurality of basic tilt angles Ss with respect to the approximate curve Ac exceeds an allowable value will be described. In this case, it can be inferred that the causes of the tilt of the chip 100 with respect to the installing surface 112 also change randomly. In this case, the controller 20 estimates a representative value of the plurality of basic tilt angles Ss as the basic tilt angle Ss[n+1] of the next substrate 110 and calculates a value to cancel the basic tilt angle Ss[n+1] as the correction amount C[n+1] of the next substrate 110. Here, the representative value is, for example, a mean, a median, or a mode. If the controller 20 estimates the representative value of the plurality of basic tilt angles Ss as the basic tilt angle Ss[n+1] of the next substrate 110, the controller 20 applies the basic tilt angles Ss[n+1] to equation 4 to calculate the next correction amount C[n+1].

Figure 7:
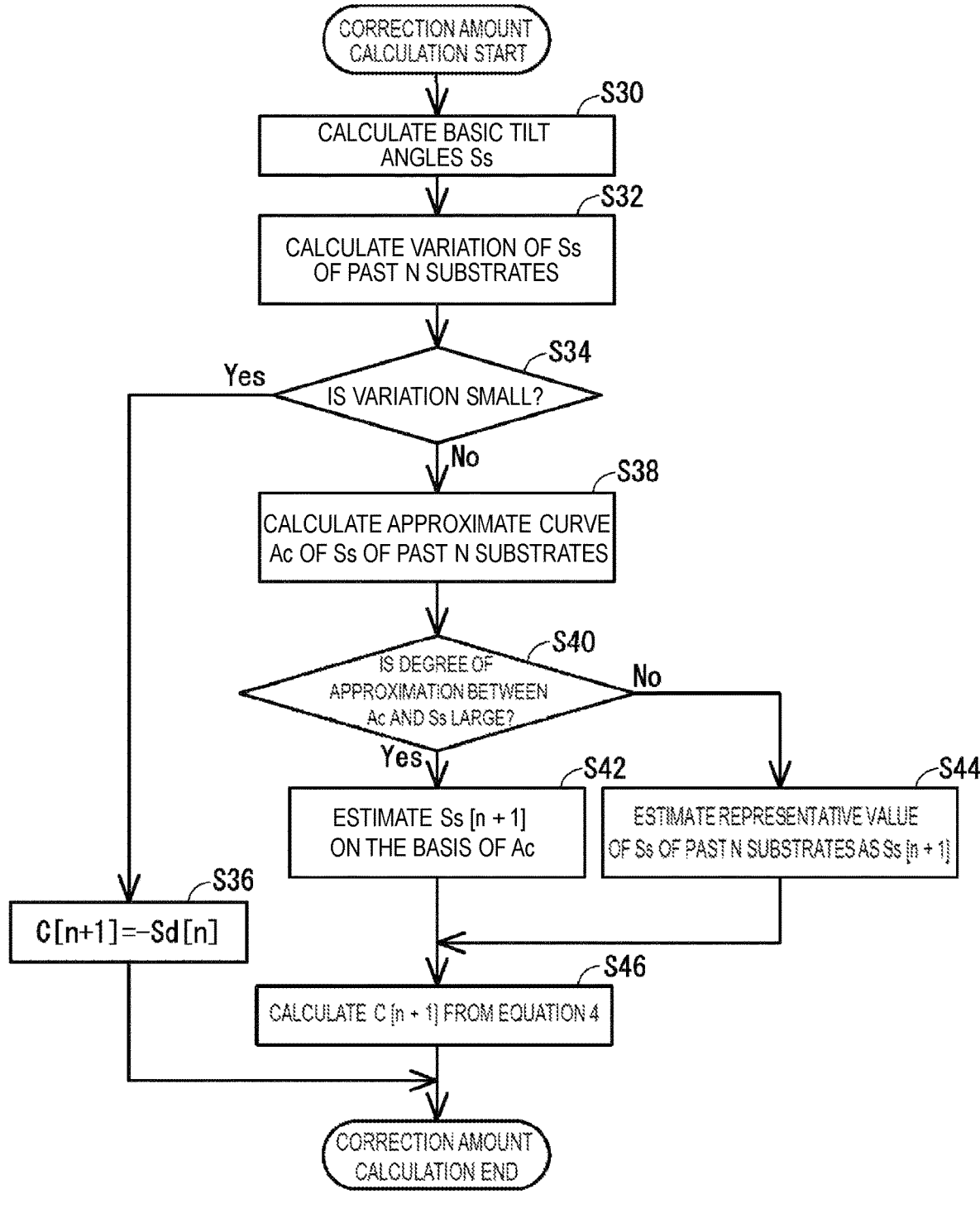
FIG. 7 is a flowchart showing a detailed flow of a correction amount calculation step.

FIG. 7 is a flowchart showing a detailed flow of a correction amount calculation step (step S20 of FIG. 4). In a case in which the correction amount C is calculated, as described above, first, the basic tilt angles Ss of the past N substrates 110 are calculated (S30). If the basic tilt angles Ss of the past N substrates can be calculated, then the variation, for example, the variance or the standard deviation of the basic tilt angles Ss of the past N substrates is calculated (S32). In a case in which the variation of the basic tilt angles Ss is small, for example, in a case in which the standard deviation is less than or equal to a specified allowable value (Yes in S34), the controller 20 calculates a value to cancel a nearest detection tilt angle Sd[n] as a correction amount C[n+1] of the next substrate 110 (S36).

On the other hand, in a case in which the variation of the basic tilt angles Ss of N substrates is large (No in S34), the controller 20 obtains an approximate curve Ac of the basic tilt angles Ss of the N substrates (S38). The approximate curve Ac obtained here may be any of a linear function, a quadratic function, an exponential function, and a logarithmic function. Further, the approximate curve Ac obtained here is not limited to one type and may be a plurality of types.

If the approximate curve Ac can be calculated, then the controller 20 compares the approximate curve Ac with the basic tilt angles Ss for N substrates (S40). As a result of the comparison, in a case in which the degree of approximation between the approximate curve Ac and the basic tilt angles Ss is large (Yes in S40), for example, in a case in which the mean square error between the approximate curve Ac and the basic tilt angles Ss is less than or equal to the allowable value, the controller 20 obtains the next basic tilt angle Ss[n+1] on the basis of the approximate curve Ac (S42). In a case in which a plurality of types of approximate curves Ac are obtained in step S38, Ss[n+1] may be obtained on the basis of an approximate curve Ac having a maximum degree of approximation among the plurality of approximate curves Ac. On the other hand, in a case in which the degree of approximation between the approximate curve Ac and the basic tilt angles Ss is small (No in S40), the controller 20 sets the representative value of the basic tilt angles Ss of the past N substrates, for example, a mean or the like as the basic tilt angle Ss[n+1] of the next substrate 110 (S44). Then, if the basic tilt angle Ss[n+1] of the next substrate 110 is obtained, the basic tilt angle Ss[n+1] is applied to equation 4 and the correction amount C[n+1] of the next substrate 110 is calculated (S46).

As is clear from the above description, in the present example, the calculation policy of the correction amount C is changed according to the change tendency of the basic tilt angle Ss. As a result, a more appropriate correction amount C can be calculated, and the degree of parallelization of the chip 100 with respect to the installing surface 112 can be further improved.

The configuration described so far is an example, and as long as at least the correction amount C of the holding surface tilt angle Sb is calculated on the basis of the detection tilt angle Sd at a necessary timing and the holding surface tilt angle Sb is changed according to the calculated correction amount C, other configurations may be changed as appropriate. For example, in the description so far, the calculation policy of the correction amount C is changed according to the change tendency of the basic tilt angle Ss. However, the procedure for calculating the correction amount C may be changed as appropriate. Therefore, for example, a value to always cancel the nearest detection tilt angle Sd [n] may be calculated as the correction amount C[n+1] of the next substrate 110 regardless of the change tendency of the basic tilt angle Ss.

Figure 8:
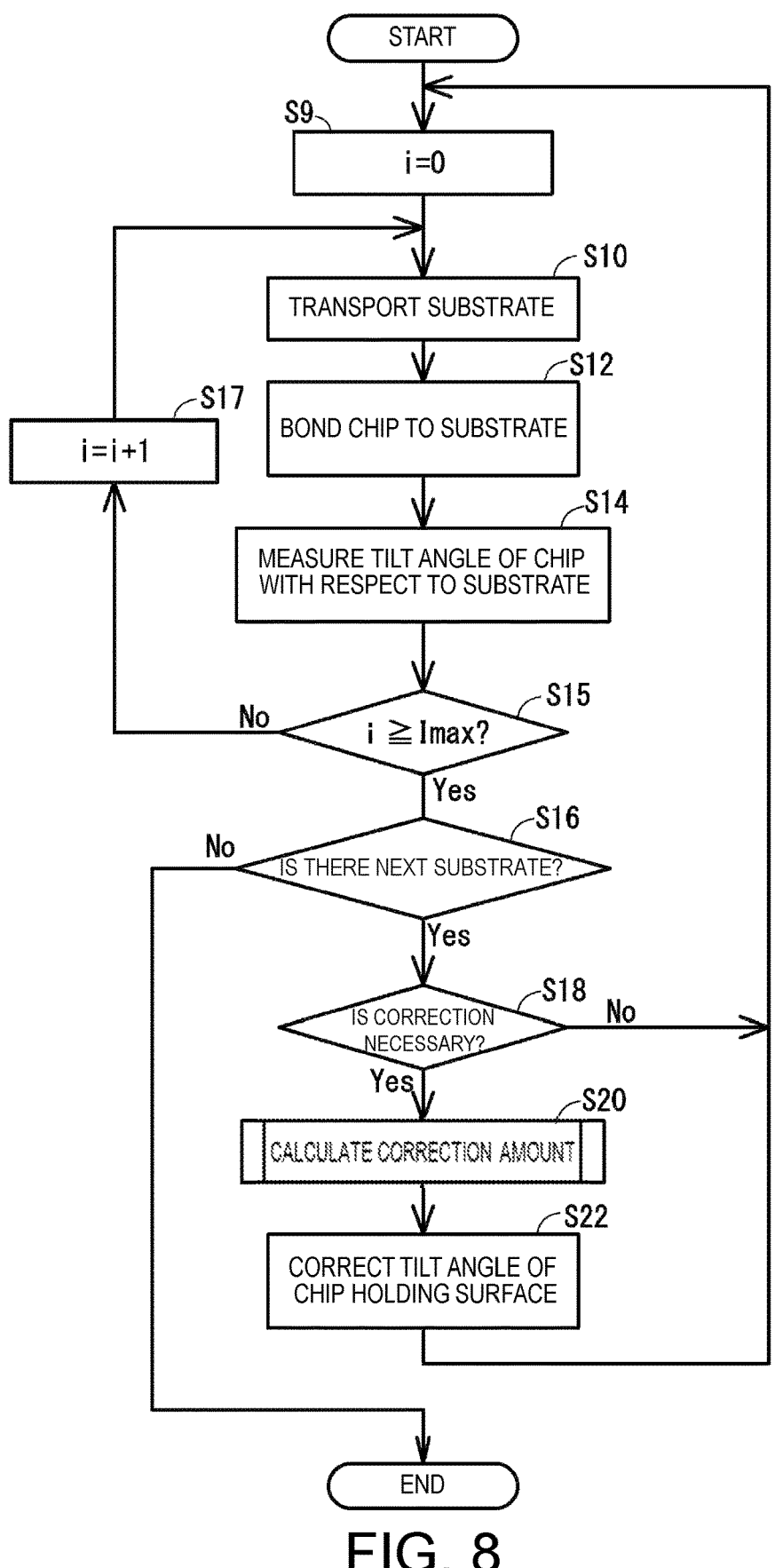
FIG. 8 is a flowchart showing another example of a flow in manufacturing a semiconductor device.

Further, in the flowchart of FIG. 4, the measurement of the detection tilt angle Sd (S14) and the correction of the holding surface tilt angle Sb (S20 and S22) are performed for each substrate 110. However, a measurement interval of the detection tilt angle Sd and an execution interval of the holding surface tilt angle Sb may be changed as appropriate. Therefore, the measurement of the detection tilt angle Sd and the correction of the holding surface tilt angle Sb may be performed at intervals of a plurality of substrates or at regular time intervals. Further, the measurement execution interval of the detection tilt angle Sd and the correction execution interval of the holding surface tilt angle Sb do not have to be the same and may be different from each other. For example, as shown in FIG. 8, the measurement of the detection tilt angle Sd (S14) is performed for each substrate 110, and the correction of the holding surface tilt angle Sb (S20 and S22) may be performed for each Imax substrate. With such a configuration, the number of times the holding surface tilt angle Sb is corrected can be reduced, and a tact time for manufacturing the semiconductor device can be reduced.

Figure 9:
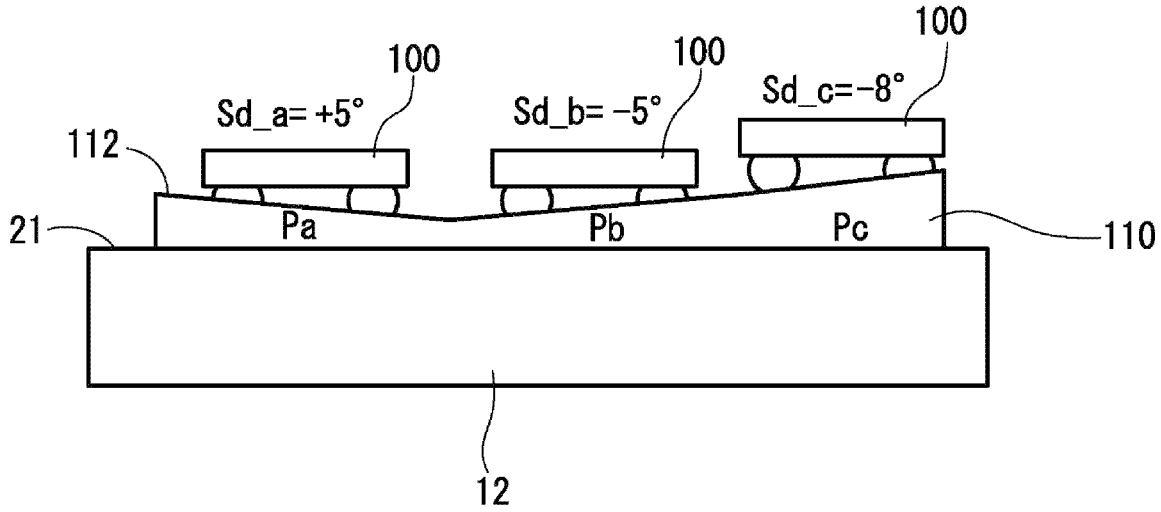
FIG. 9 is a conceptual view showing a state of a variation of a detection tilt angle for each position.

Further, in the description so far, the holding surface tilt angle Sb is corrected in a unit of the substrate 110, but the holding surface tilt angle Sb may be corrected for each position in the substrate 110. For example, as shown in FIG. 9, in a case in which the detection tilt angles Sd_a to Sd_c differ depending on the positions Pa to Pc in the substrate 110, the controller 20 generates a map in which the positions Pa to Pc in the substrate 110 and the detection tilt angles Sd_a to Sd_c thereof are recorded to be associated with each other. Then, on the basis of this map, the correction amounts C_a to C_c for the positions Pa to Pc may be calculated, and the holding surface tilt angle Sb may be corrected for each of the positions Pa to Pc. With such a configuration, the degree of parallelization of the chip 100 with respect to the installing surface 112 can be further improved.

Further, in the present example, the holding surface tilt angle Sb is changed by swinging the installing tool 22. However, the holding surface tilt angle Sb may be changed by swinging the stage 12 instead of the installing tool 22. For example, by supporting the stage 12 by a plurality of support columns capable of advancing and retreating and by adjusting the amount of advancing and retreating of the support columns, it is possible to change a tilt of the stage 12 and the tilt angle of the chip holding surface 26 with respect to the loading surface 21 (that is, the holding surface tilt angle Sb).

The invention claimed is:

1. A semiconductor device manufacturing device comprising:

a stage that has a loading surface on which a substrate is loaded;

an installing head that has a chip holding surface for holding a chip and disposes the chip on the substrate loaded on the stage;

a measuring mechanism that measures a tilt angle of the chip loaded on an installing surface of the substrate by the installing head with respect to the installing surface as a detection tilt angle;

a holding surface adjusting mechanism that changes a holding surface tilt angle which is a tilt angle of the chip holding surface with respect to the loading surface; and a controller that calculates a correction amount of the holding surface tilt angle on a basis of the detection tilt angle and changes the holding surface tilt angle by the holding surface adjusting mechanism according to the correction amount calculated, wherein the controller stores a plurality of detection tilt angles measured in the past; and wherein the controller obtains a basic tilt angle by removing an influence of correction of the holding surface tilt angle from each of the plurality of detection tilt angles and changes a calculation policy of the correction amount according to a change tendency of the basic tilt angle between the substrates.

2. The semiconductor device manufacturing device according to claim 1, wherein, in a case in which a variation of the basic tilt angle between the substrates is equal to or less than a specified allowable value, the controller calculates a value to cancel the detection tilt angle obtained for a nearest substrate as the correction amount.

3. The semiconductor device manufacturing device according to claim 2, wherein, in a case in which the basic tilt angle changes between the substrates with a predetermined regularity, the controller estimates a basic tilt angle of a next substrate according to the regularity and calculates a value to cancel the basic tilt angle as the correction amount.

4. The semiconductor device manufacturing device according to claim 2, wherein, in a case in which the basic tilt angle changes randomly between the substrates, the controller estimates a representative value of a plurality of the basic tilt angles obtained for a plurality of the substrates as a basic tilt angle of a next substrate and calculates a value to cancel the basic tilt angle as the correction amount.

5. The semiconductor device manufacturing device according to claim 2, wherein, in a case in which the detection tilt angle is obtained for each of a plurality of chips loaded on one substrate, the controller treats a representative value of a plurality of the detection tilt angles obtained for the plurality of chips as the detection tilt angle of the one substrate.

6. The semiconductor device manufacturing device according to claim 2, wherein, in a case in which the detection tilt angle is obtained for each of a plurality of chips loaded on one substrate, the controller generates a map in which a correspondence between a position of each chip in the substrate and the detection tilt angle of each chip is recorded and calculates the correction amount for each chip position on a basis of the map.

7. The semiconductor device manufacturing device according to claim 1, wherein, in a case in which the basic tilt angle changes between the substrates with a predetermined regularity, the controller estimates a basic tilt angle of a next substrate according to the regularity and calculates a value to cancel the basic tilt angle as the correction amount.

8. The semiconductor device manufacturing device according to claim 7, wherein, in a case in which the basic tilt angle changes randomly between the substrates, the controller estimates a representative value of a plurality of the basic tilt angles obtained for a plurality of the substrates as a basic tilt angle of a next substrate and calculates a value to cancel the basic tilt angle as the correction amount.

9. The semiconductor device manufacturing device according to claim 7, wherein, in a case in which the detection tilt angle is obtained for each of a plurality of chips loaded on one substrate, the controller treats a representative value of a plurality of the detection tilt angles obtained for the plurality of chips as the detection tilt angle of the one substrate.

10. The semiconductor device manufacturing device according to claim 7, wherein, in a case in which the detection tilt angle is obtained for each of a plurality of chips loaded on one substrate, the controller generates a map in which a correspondence between a position of each chip in the substrate and the detection tilt angle of each chip is recorded and calculates the correction amount for each chip position on a basis of the map.

11. The semiconductor device manufacturing device according to claim 1, wherein, in a case in which the basic tilt angle changes randomly between the substrates, the controller estimates a representative value of a plurality of the basic tilt angles obtained for a plurality of the substrates as a basic tilt angle of a next substrate and calculates a value to cancel the basic tilt angle as the correction amount.

12. The semiconductor device manufacturing device according to claim 11, wherein, in a case in which the detection tilt angle is obtained for each of a plurality of chips loaded on one substrate, the controller treats a representative value of a plurality of the detection tilt angles obtained for the plurality of chips as the detection tilt angle of the one substrate.

13. The semiconductor device manufacturing device according to claim 11, wherein, in a case in which the detection tilt angle is obtained for each of a plurality of chips loaded on one substrate, the controller generates a map in which a correspondence between a position of each chip in the substrate and the detection tilt angle of each chip is recorded and calculates the correction amount for each chip position on a basis of the map.

14. The semiconductor device manufacturing device according to claim 1, wherein, in a case in which the detection tilt angle is obtained for each of a plurality of chips loaded on one substrate, the controller treats a representative value of a plurality of the detection tilt angles obtained for the plurality of chips as the detection tilt angle of the one substrate.

15. The semiconductor device manufacturing device according to claim 1, wherein, in a case in which the detection tilt angle is obtained for each of a plurality of chips loaded on one substrate, the controller generates a map in which a correspondence between a position of each chip in the substrate and the detection tilt angle of each chip is recorded and calculates the correction amount for each chip position on a basis of the map.

16. The semiconductor device manufacturing device according to claim 1, wherein the installing head has an installing tool that includes the chip holding surface and a spherical air bearing that holds the installing tool, wherein the spherical air bearing is capable of switching between a free state in which the installing tool is held with its swinging allowed and a locked state in which the installing tool is held with its swinging hindered, and wherein the holding surface adjusting mechanism has a tilt plate with which the chip holding surface is brought into contact, and a plurality of support columns that supports the tilt plate and advances and retreats independently of each other to arbitrarily change an angle of the tilt plate.

17. A semiconductor device manufacturing method comprising:

a bonding step of holding a chip with a chip holding surface of an installing tool and moving the installing tool to load the chip on an installing surface of a substrate loaded on a loading surface of a stage;

a measurement step of measuring a tilt angle between an upper surface of the chip loaded on the installing surface and the installing surface as a detection tilt angle;

a correction amount calculation step of calculating a correction amount of a holding surface tilt angle, which is a tilt angle of the chip holding surface with respect to the stage, on a basis of the detection tilt angle; and a correction step of changing the holding surface tilt angle according to the correction amount by a holding surface adjusting mechanism that changes the holding surface tilt angle, wherein a controller stores a plurality of detection tilt angles measured in the past, and the controller obtains a basic tilt angle by removing an influence of correction of the holding surface tilt angle from each of the plurality of detection tilt angles and changes a calculation policy of the correction amount according to a change tendency of the basic tilt angle between the substrates.

* * * * *